United States Patent
Chen et al.

(10) Patent No.: US 12,088,325 B2
(45) Date of Patent: Sep. 10, 2024

(54) FILTER SYSTEM AND OPERATION METHOD THEREOF

(71) Applicants: Dynami Vision Ltd., Taipei (TW); Chung Yuan Christian University, Taoyuan (TW)

(72) Inventors: Shih-Lun Chen, Taoyuan (TW); Tsun-Kuang Chi, Taoyuan (TW); Chien-Rung Huang, Taoyuan (TW); Hsiao-Chi Chen, Taoyuan (TW)

(73) Assignees: Dynami Vision Ltd., Taipei (TW); Chung Yuan Christian University, Taoyuan (TW)

( * ) Notice: Subject to any disclaimer, the term of this patent is extended or adjusted under 35 U.S.C. 154(b) by 181 days.

(21) Appl. No.: 17/985,167

(22) Filed: Nov. 11, 2022

(65) Prior Publication Data

US 2023/0208434 A1 Jun. 29, 2023

(30) Foreign Application Priority Data

Dec. 29, 2021 (TW) ................................. 110149353

(51) Int. Cl.
*H03M 3/00* (2006.01)
*H03H 17/02* (2006.01)
*H04B 1/12* (2006.01)

(52) U.S. Cl.
CPC ............ *H03M 3/454* (2013.01); *H04B 1/123* (2013.01); *H03H 17/0294* (2013.01); *H03H 2017/0297* (2013.01)

(58) Field of Classification Search
CPC ... H03M 3/454; H04B 1/123; H03H 17/0294; H03H 2017/0297
USPC ................................. 341/110, 143, 144, 155
See application file for complete search history.

(56) References Cited

U.S. PATENT DOCUMENTS

| 4,713,662 A | * | 12/1987 | Wiegand | G01S 7/38 |
| | | | | 342/13 |
| 7,602,320 B2 | * | 10/2009 | Klein | H03M 1/186 |
| | | | | 341/110 |
| 8,938,203 B2 | | 1/2015 | Ancora et al. | |

FOREIGN PATENT DOCUMENTS

| CN | 108432147 | 5/2020 |
| EP | 1160978 | 12/2001 |
| TW | I325685 | 6/2010 |
| TW | I334702 | 12/2010 |
| TW | I336168 | 1/2011 |

(Continued)

*Primary Examiner* — Khai M Nguyen
(74) *Attorney, Agent, or Firm* — JCIPRNET

(57) ABSTRACT

A filter system includes: a first mixer, converting an input signal into a first signal according to a reference frequency signal, wherein the reference frequency signal corresponding to a target frequency band; an analog-to-digital converter, coupled to the first mixer, converting the first signal into a first digital signal; a digital filter, coupled to the analog-to-digital converter, filtering the first digital signal according to a first frequency band and generating a second digital signal, wherein the first frequency band corresponding to the first signal; a digital-to-analog converter coupled to the digital filter, converting the second digital signal into a second signal; and a second mixer, coupled to the digital-to-analog converter, converting the second signal into an output signal according to the reference frequency signal, wherein the output signal corresponds to the input signal filtered by the target frequency band.

23 Claims, 9 Drawing Sheets

(56) References Cited

FOREIGN PATENT DOCUMENTS

| TW | I370637 | 8/2012 |
|----|---------|--------|
| TW | I374609 | 10/2012 |
| TW | I381396 | 1/2013 |
| TW | I389134 | 3/2013 |
| TW | I426719 | 2/2014 |
| TW | I482465 | 4/2015 |
| TW | I539742 | 6/2016 |
| TW | I571052 | 2/2017 |
| TW | I612447 | 1/2018 |
| TW | I681625 | 1/2020 |
| TW | I692939 | 5/2020 |
| TW | I702795 | 8/2020 |

* cited by examiner

FILTER SYSTEM AND OPERATION METHOD THEREOF

CROSS-REFERENCE TO RELATED APPLICATION

This application claims the priority benefit of Taiwan application serial no. 110149353, filed on Dec. 29, 2021. The entirety of the above-mentioned patent application is hereby incorporated by reference herein and made a part of this specification.

BACKGROUND

Technical Field

The disclosure relates to a communication technology, and in particular relates to a filter system and an operation method thereof.

Description of Related Art

General communication products need to be equipped with filters to filter out the noise in the non-main receiving frequency band. At present, most of the filter elements in communication products are passive elements or filters of a single frequency band to process signal filtering. For example, in the existing filtering technology, surface acoustic wave (SAW) elements are widely used in communication products. However, when a communication product requires filtering functions in different frequency bands, multiple single frequency band filters must be used such that the communication products conform to the specifications for normal operation in the corresponding frequency band.

Since countries may use different communication frequency bands, communication products usually are required to dispose multiple filters corresponding to the frequency bands of each country in order to operate normally in all frequency bands. For example, when the communication product is used in Japan and the United States, the communication product needs to contain a filter that conforms to the frequency bands in the United States and Japan. In order to respond to different frequency bands, communication products greatly increase the number of surface acoustic wave elements, which increases the cost of components and greatly occupies the limited area of the printed circuit board.

In addition, with the development of different communication standards, for example, the frequency bands used by 4G and 5G mobile communication, Internet of Things, etc. have different characteristics, and the signal coverage of the place where the communication product is used may also be different. When the communication product is located in a field that is too far from the signal transmitting end, the signal attenuation causes the issue of reducing the efficiency of the product.

SUMMARY

In view of this, the disclosure provides a filter system and an operation method thereof, which may adjust the filter frequency band through a programmable structure, so that a communication product may achieve the effect of filtering the filter frequency band of multiple filters through a single filter system.

An embodiment of the disclosure provides a filter system, including: a first mixer for converting an input signal into a first signal according to a reference frequency signal. The reference frequency signal corresponds to a target frequency band. An analog-to-digital converter is coupled to the first mixer to convert the first signal into a first digital signal. A digital filter is coupled to the analog-to-digital converter to filter the first digital signal according to a first frequency band and generate a second digital signal. The first frequency band corresponds to the first signal. A digital-to-analog converter is coupled to the digital filter to convert the second digital signal into a second signal. A second mixer is coupled to the digital-to-analog converter to convert the second signal into an output signal according to the reference frequency signal. The output signal corresponds to the input signal filtered by the target frequency band.

On the other hand, an embodiment of the disclosure provides an operation method suitable for a filter system, including the following operation. An input signal is converted into a first signal according to a reference frequency signal, in which the reference frequency signal corresponds to a target frequency band. The first signal is converted into a first digital signal. The first digital signal is filtered according to a first frequency band to generate a second digital signal, in which the first frequency band corresponds to the first signal. The second digital signal is converted into a second signal. The second signal is converted into an output signal according to the reference frequency signal, in which the output signal corresponds to the input signal filtered by the target frequency band.

Based on the above, in the filter system and the operation method thereof provided by the embodiments of the disclosure, an active filter system architecture may be used to adjust the filter frequency band in a way of integrating software and hardware, whereby communication products may use a single filter system to achieve the effect of filtering the filter frequency band of multiple filters. In addition, compared with the conventional passive filter element, the filter system of the embodiment of the disclosure adopts an active filter system structure, which may adjust the signal gain through the supply of additional power, thereby solving the problem of signal attenuation caused by the communication environment, and improving the signal strength in the condition of serious signal attenuation, therefore improving the use efficiency of communication products.

DETAILED DESCRIPTION OF DISCLOSED EMBODIMENTS

Figure 1:
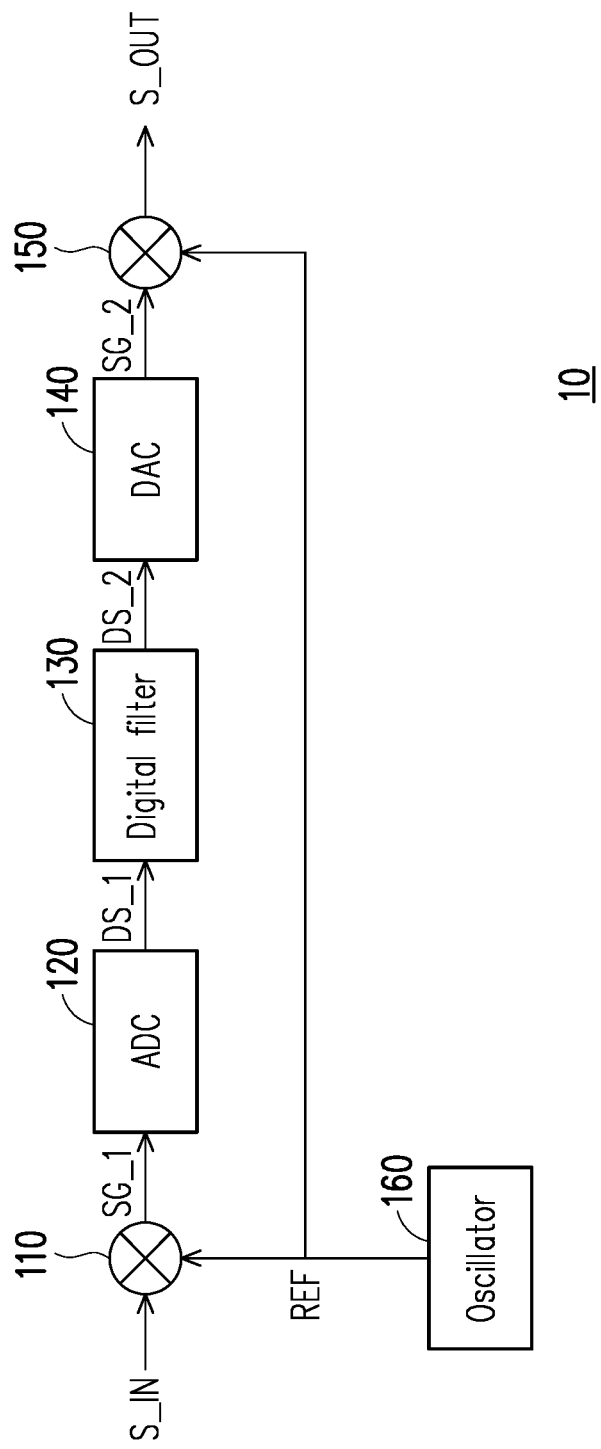
FIG. 1 is a schematic diagram of a filter system according to a first embodiment of the disclosure.

A portion of the embodiments of the disclosure will be described in detail with reference to the accompanying drawings. Element symbol referenced in the following description will be regarded as the same or similar element when the same element symbol appears in different drawings. These examples are only a portion of the disclosure and do not disclose all possible embodiments of the disclosure. More precisely, these embodiments are only examples of the system and method within the scope of the patent application of the disclosure. Wherever possible, elements/components/steps with the same reference numerals in the drawings and embodiments represent the same or similar parts. Elements/components/steps that use the same reference numerals or use the same terminology in different embodiments may refer to relevant descriptions of each other.

First Embodiment

FIG. 1 is a schematic diagram of a filter system according to a first embodiment of the disclosure. Referring to FIG. 1, the filter system 10 includes a first mixer 110, an analog-to-digital converter (ADC) 120, a digital filter 130, a digital-to-analog converter (DAC) 140, a second mixer 150, and an oscillator 160. The analog-to-digital converter 120 is coupled to the first mixer 110. The digital filter 130 is coupled to the analog-to-digital converter 120. The digital-to-analog converter 140 is coupled to the digital filter 130. The second mixer 150 is coupled to the digital-to-analog converter 140. The oscillator 160 is coupled to the first mixer 110 and the second mixer 150.

Figure 2:
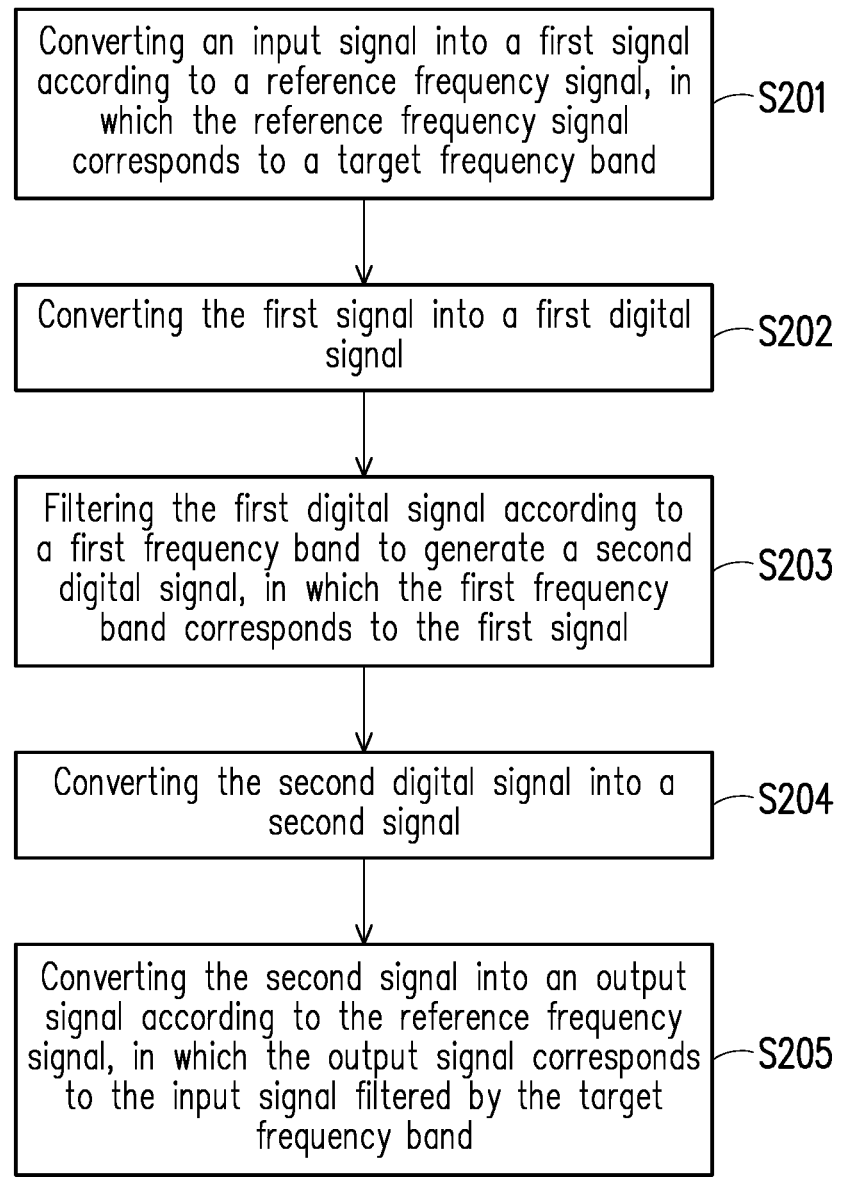
FIG. 2 is a flowchart of an operation method according to the first embodiment of the disclosure.

FIG. 2 is a flowchart of an operation method according to the first embodiment of the disclosure. The operation method of FIG. 2 is suitable for the filter system 10 shown in FIG. 1, and the operation of the filter system 10 is described in detail below with reference to FIG. 1 and FIG. 2.

In step S201, the first mixer 110 converts the input signal S_IN into the first signal SG_1 according to the reference frequency signal REF. The reference frequency signal corresponds to a target frequency band. In step S202, the analog-to-digital converter 120 converts the first signal SG_1 into a first digital signal DS_1. In step S203, the digital filter 130 filters the first digital signal DS_1 according to a first frequency band and generates a second digital signal DS_2, in which the first frequency band corresponds to the first signal SG_1. In step S204, the digital-to-analog converter 140 converts the second digital signal DS_2 into a second signal SG_2. In step S205, the second mixer 150 converts the second signal SG_2 into an output signal S_OUT according to the reference frequency signal REF.

Specifically, the input signal S_IN is, for example, a radio frequency signal to be filtered. After the input signal S_IN enters the filter system 10, the filter system 10 may filter the input signal S_IN according to the target frequency band to generate the output signal S_OUT. For example, the target frequency band may be an operating frequency band that conforms to a communication standard regulation.

Figure 3A:
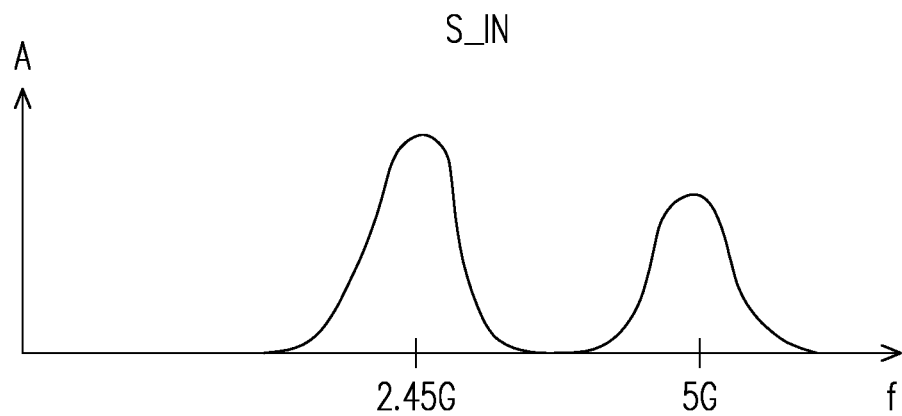
FIG. 3A is a schematic diagram of a frequency spectrum of an input signal in an embodiment of the disclosure.

FIG. 3A is a schematic diagram of a frequency spectrum of an input signal S_IN in an embodiment of the disclosure. In FIG. 3A, the vertical axis is the amplitude A, and the horizontal axis is the frequency f. As shown in FIG. 3A, in one embodiment, the input signal S_IN may include radio frequency signal components with frequencies of 2.45 GHz and 5 GHz.

In one embodiment, the oscillator 160 may be implemented by an oscillator circuit. In one embodiment, the oscillator 160 may be, for example, a digitally controlled crystal oscillator (DCXO). The oscillator 160 provides the reference frequency signal REF to the first mixer 110 and the second mixer 150. For example, in one embodiment, when the target frequency band is 2.45 GHz, the oscillator 160 may provide the reference frequency signal REF to set the reference frequency to 2.4 GHz. It should be noted that, in an embodiment, when designing the reference frequency signal REF corresponding to the target frequency band, the design may also consider the operating frequency band of the digital filter according to application requirements. For example, in one embodiment, when the filtering frequency band of the digital filter is 1.45 GHz, the reference frequency is designed to be 1 GHz to conform to the system where the filtering target frequency band is 2.45 GHz.

The first mixer 110 may perform frequency conversion and use switch sampling to reduce the high frequency signal to an intermediate frequency or a fundamental frequency. For example, the first mixer 110 may down-convert the input signal S_IN according to the reference frequency signal REF to generate the first signal SG_1. The frequency of the first signal SG_1 is lower than the frequency of the input signal S_IN. The first signal SG_1 is an analog signal. After the first signal SG_1 is converted into the first digital signal DS_1 by the analog-to-digital converter 120, the digital filter 130 performs filtering processing to generate the second digital signal DS_2.

Figure 3B:
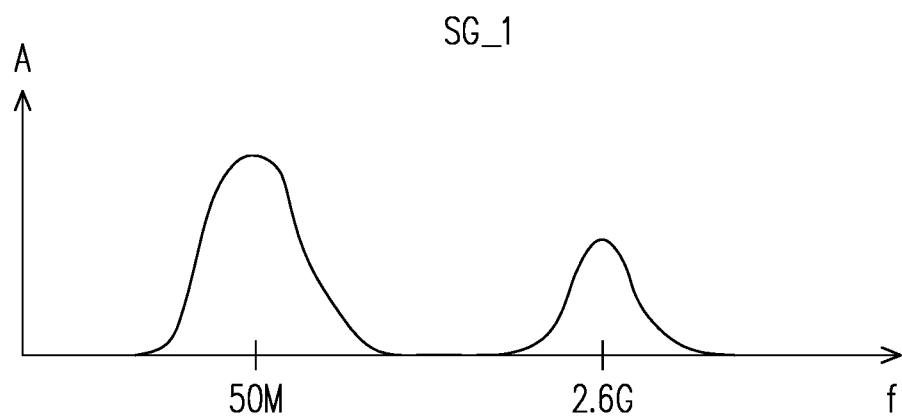
FIG. 3B is a schematic diagram of the frequency spectrum of the first signal in an embodiment of the disclosure.

FIG. 3B is a schematic diagram of the frequency spectrum of the first signal SG_1 in an embodiment of the disclosure. In FIG. 3B, the vertical axis is the amplitude A, and the horizontal axis is the frequency f. Specifically, in one embodiment, the input signal S_IN includes radio frequency signals with a frequency of 2.45 GHz and a frequency of 5 GHz, and the first mixer 110 down-converts the input signal S_IN according to the reference frequency of 2.4 GHz to generate the first signal SG_1. As shown in FIG. 3B, the first signal SG_1 includes analog signals with frequencies of 50 MHz and 2.6 GHz.

The digital filter 130 may be, for example, a finite impulse response (FIR) filter. The digital filter 130 may change the filtering frequency band by adjusting the weighting coefficient. The digital filter 130 filters the first digital signal DS_1 to generate the second digital signal DS_2. The filtered second digital signal DS_2 is then converted into a second signal SG_2 by the digital-to-analog converter 140. The second signal SG_2 is an analog signal, and the frequency of the second signal SG_2 is the fundamental frequency or the intermediate frequency.

Figure 3C:
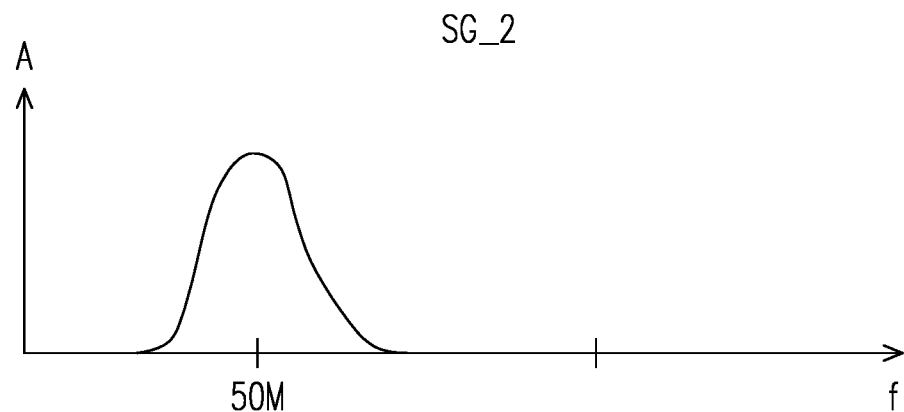
FIG. 3C is a schematic diagram of the frequency spectrum of the second signal in an embodiment of the disclosure.

FIG. 3C is a schematic diagram of the frequency spectrum of the second signal SG_2 in an embodiment of the disclosure. In FIG. 3C, the vertical axis is the amplitude A, and the horizontal axis is the frequency f. For example, in one embodiment, since the first signal SG_1 includes analog signals with frequencies of 50 MHz and 2.6 GHz, the digital filter 130 may filter according to the first frequency band (e.g., 50 MHz), and after the filtered second digital signal DS_2 is converted into the second signal SG_2 by the digital-to-analog converter 140, the frequency of the second signal SG_2 is an intermediate frequency or a fundamental frequency (e.g., 50 MHz) as shown in FIG. 3C.

Next, the second mixer 150 may perform frequency conversion and use switch sampling to achieve up-conversion. For example, the second mixer 150 up-converts the second signal SG_2 from the base frequency or the intermediate frequency according to the reference frequency signal REF to generate the output signal S_OUT. The frequency of the output signal S_OUT is greater than that of the second signal SG_2.

The output signal S_OUT corresponds to the input signal S_IN filtered by the target frequency band. For example, the target frequency band may be a frequency band with a pass band of 843 to 875 megahertz (MHz) that conforms to the ZWAVE communication specification, and the target frequency band may be a frequency band of the narrowband Internet of Things (NB-IoT) communication specification, alternatively, the target frequency band may be the operating frequency band of 4G and 5G mobile communications regulated by various countries (e.g., the United States or Japan).

Figure 3D:
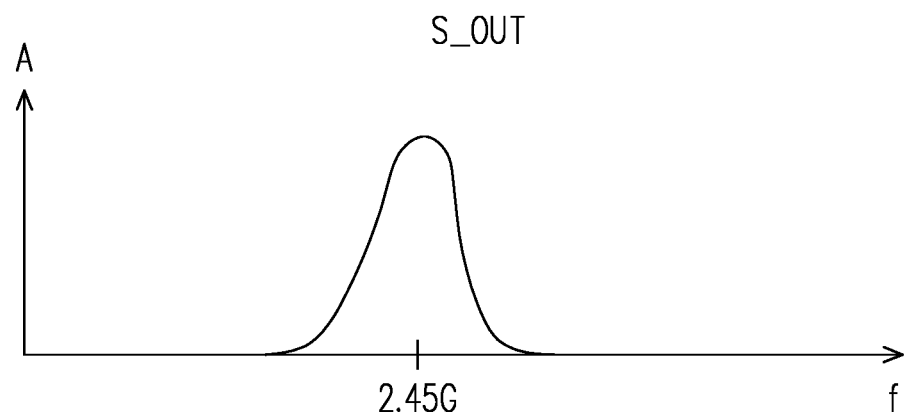
FIG. 3D is a schematic diagram of a frequency spectrum of an output signal in an embodiment of the disclosure.

FIG. 3D is a schematic diagram of a frequency spectrum of an output signal in an embodiment of the disclosure. In FIG. 3D, the vertical axis is the amplitude A, and the horizontal axis is the frequency f. In one embodiment, the target frequency band is 2.45 GHz, the frequency of the filtered second signal SG_2 is in the frequency band of 50 MHz, and the second mixer 150 up-converts the second signal SG_2 according to the reference frequency 2.4 GHz of the reference frequency signal REF to generate an output signal S_OUT that conforms to the target frequency band of 2.45 GHz. The output signal S_OUT corresponds to the input signal S_IN filtered by the target frequency band.

In the first embodiment of the disclosure, after the input signal S_IN enters the filter system 10, the first mixer 110 down-converts the input signal S_IN to a lower frequency first signal SG_1 according to the reference frequency signal REF provided by the oscillator 160 and corresponding to the target frequency band. The analog-to-digital converter 120 converts the first signal SG_1 into a first digital signal DS_1, and the digital filter 130 filters the first digital signal DS_1 to generate a second digital signal DS_2 corresponding to the first frequency band. The digital-to-analog converter 140 converts the second digital signal DS_2 into a second signal SG_2, and then up-converts the second signal SG_2 into an output signal S_OUT through the second mixer 150 according to the reference frequency signal REF. The filter system 10 of the first embodiment of the disclosure may filter the input signal S_IN according to the target frequency band to generate the output signal S_OUT. In this way, the output signal S_OUT generated after the input signal S_IN is filtered may conform to the communication specification of the target frequency band.

Second Embodiment

Figure 4:
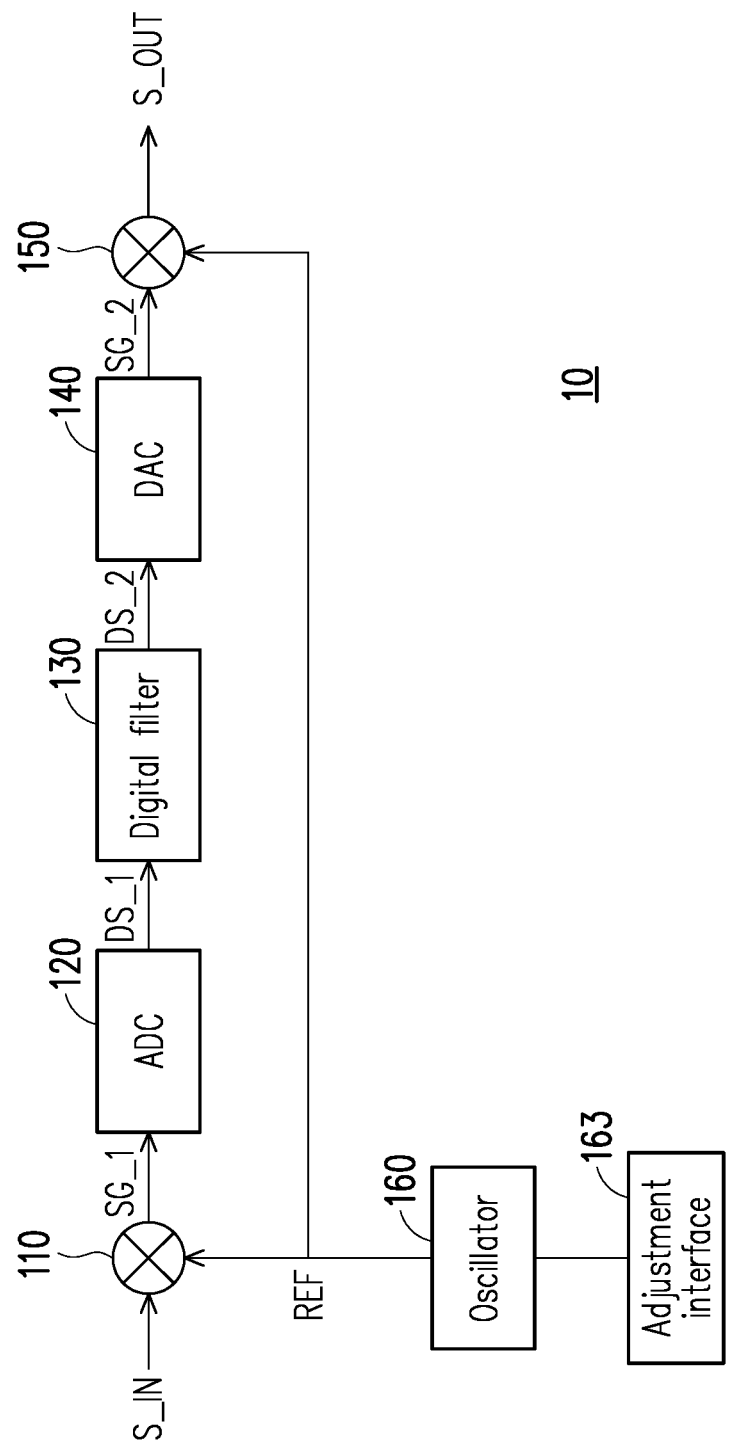
FIG. 4 is a schematic diagram of a filter system according to a second embodiment of the disclosure.

FIG. 4 is a schematic diagram of a filter system according to a second embodiment of the disclosure. Referring to FIG. 4, in one embodiment, the filter system 10 further includes an adjustment interface 163. The adjustment interface 163 is coupled to the oscillator 160. The adjustment interface 163 transmits an adjustment signal to the oscillator 160. The adjustment signal corresponds to the target frequency band. The oscillator 160 is, for example, a digitally controlled crystal oscillator (DCXO). The oscillator 160 may adjust the reference frequency signal REF according to the adjustment signal. Specifically, the adjustment interface 163 may be a serial or parallel interface, such as a serial peripheral interface (SPI) or an inter-integrated circuit (IIC) interface.

According to different communication specifications, the frequency band in which the filter system 10 operates needs to be adjusted accordingly. For example, the target frequency band may be ZWAVE, NB-IoT or the operation frequency band of 4G and 5G mobile communication corresponding to various national regulations. According to the second embodiment of the disclosure, an adjustment signal may be transmitted from the adjustment interface 163 to the oscillator 160 to adjust the reference frequency signal REF, and the input signal S_IN may be down-converted according to the reference frequency signal REF and filtered according to the first frequency band corresponding to the first signal SG_1 through the digital filter 130. The second embodiment of the disclosure uses the reference frequency signal REF provided by the oscillator 160 to greatly adjust the frequency of the input signal S_IN, thereby reducing the hardware design requirement of the digital filter 130. Even though the variable range of the weighting coefficient of the digital filter 130 is small under the condition that the same circuit hardware is fixed, the operating frequency band of the filter system 10 is not limited.

Third Embodiment

Figure 5:
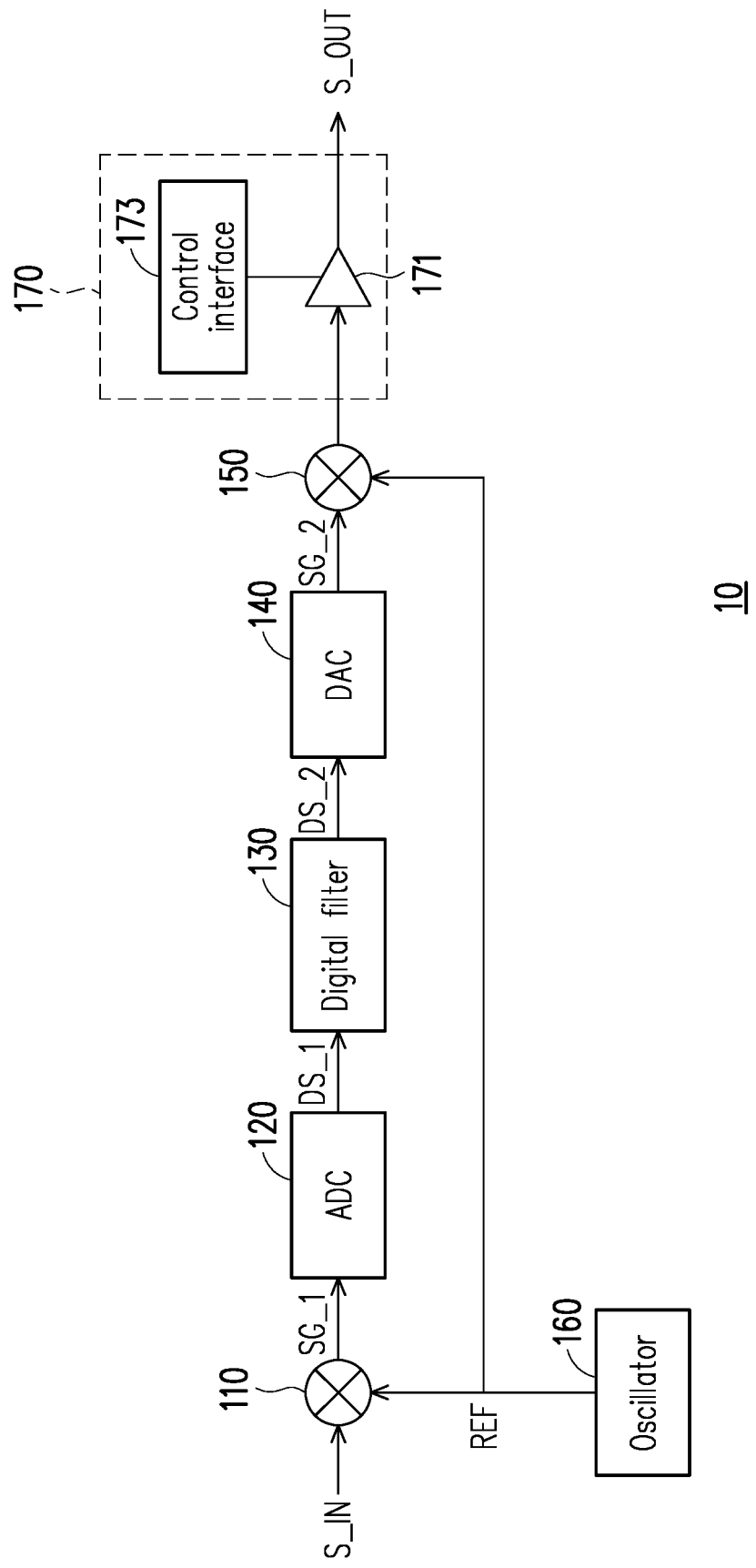
FIG. 5 is a schematic diagram of a filter system according to a third embodiment of the disclosure.

FIG. 5 is a schematic diagram of a filter system according to a third embodiment of the disclosure. Referring to FIG. 5, in one embodiment, the filter system 10 further includes a gain controller 170. The gain controller 170 includes an amplifier 171 and a control interface 173. The amplifier 171 is coupled to the second mixer 150. The control interface 173 is coupled to the amplifier 171. After the second mixer 150 converts the second signal SG_2 into the output signal S_OUT according to the reference frequency signal REF, the output signal S_OUT passes through the gain controller 170, and the output signal S_OUT is amplified by the amplifier 171. The control interface 173 controls a signal gain of the amplifier 171.

Specifically, the control interface 173 may be implemented by an analog-digital hybrid circuit or an analog circuit. In one embodiment, the control interface 173 may integrate an analog-digital hybrid circuit and include a digital control interface, and the digital control interface may be a serial or parallel interface, such as serial peripheral interface (SPI) or an inter-integrated circuit (IIC) interface.

In one embodiment, the control interface 173 detects the signal strength of the input signal S_IN, and determines the signal gain according to the signal strength of the input signal S_IN. For example, after detecting the signal strength of the input signal S_IN, the control interface 175 performs adaptive control and adjusts the amplifier 172 according to the signal strength of the input signal S_IN to amplify the signal gain of the output signal S_OUT.

In one embodiment, the control interface 173 receives a control message, and determines the signal gain according to the control message. For example, the control interface 173 may receive control messages input by the user. The control message may include the signal strength of the input signal S_IN, the signal strength of the output signal S_OUT, or the specification requirements of the external device.

In the third embodiment of the disclosure, the signal strength of the output signal S_OUT of the filter system 10 may be adjusted by the gain controller 170, thereby, even if the communication product is in the condition of serious signal attenuation, the signal strength may still be increased through the gain controller 170, therefore improving the use efficiency of the communication product.

Fourth Embodiment

Figure 6:
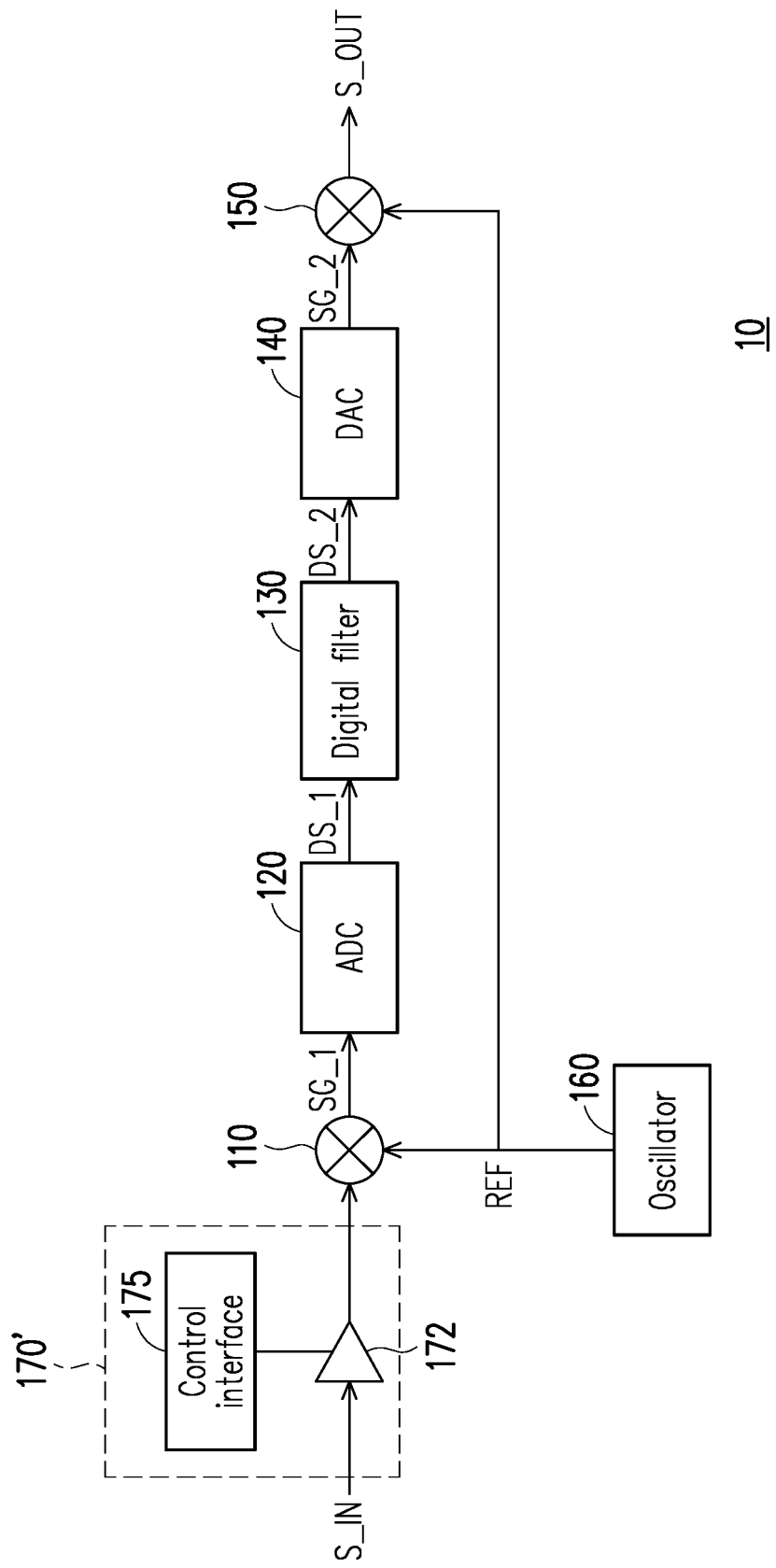
FIG. 6 is a schematic diagram of a filter system according to a fourth embodiment of the disclosure.

FIG. 6 is a schematic diagram of a filter system according to a fourth embodiment of the disclosure. Referring to FIG.

6, in one embodiment, the filter system 10 further includes a gain controller 170' (also referred to as an input gain controller). The gain controller 170' includes an amplifier 172 (also referred to as an input amplifier) and a control interface 175. The amplifier 172 is coupled to the first mixer 110. The control interface 175 is coupled to the amplifier 172. After the filter system 10 receives the input signal S_IN, the input signal S_IN is amplified by the amplifier 172 through the gain controller 170' and transmitted to the first mixer 110. The control interface 175 controls a signal gain of the amplifier 172.

Specifically, the control interface 175 may be implemented by an analog-digital hybrid circuit or an analog circuit. In one embodiment, the control interface 175 may integrate an analog-digital hybrid circuit and include a digital control interface, and the digital control interface may be a serial or parallel interface, such as serial peripheral interface (SPI) or an inter-integrated circuit (IIC) interface.

In one embodiment, the control interface 175 detects the signal strength of the input signal S_IN, and determines the signal gain according to the signal strength of the input signal S_IN. For example, after detecting the signal strength of the input signal S_IN, the control interface 175 performs adaptive control and adjusts the amplifier 172 according to the signal strength of the input signal S_IN to amplify the signal gain of the input signal S_IN.

In one embodiment, the control interface 175 receives a control message, and determines the signal gain according to the control message. For example, the control interface 175 may receive control messages input by the user. The control message may include the signal strength of the input signal S_IN, the signal strength of the output signal S_OUT, or the specification requirements of the external device.

In the fourth embodiment of the disclosure, the signal strength of the input signal S_IN of the filter system 10 may be adjusted by the gain controller 170', thereby, even if the communication product is in the condition of serious signal attenuation, the signal strength may still be increased through the gain controller 170', therefore improving the use efficiency of the communication product.

Fifth Embodiment

Figure 7:
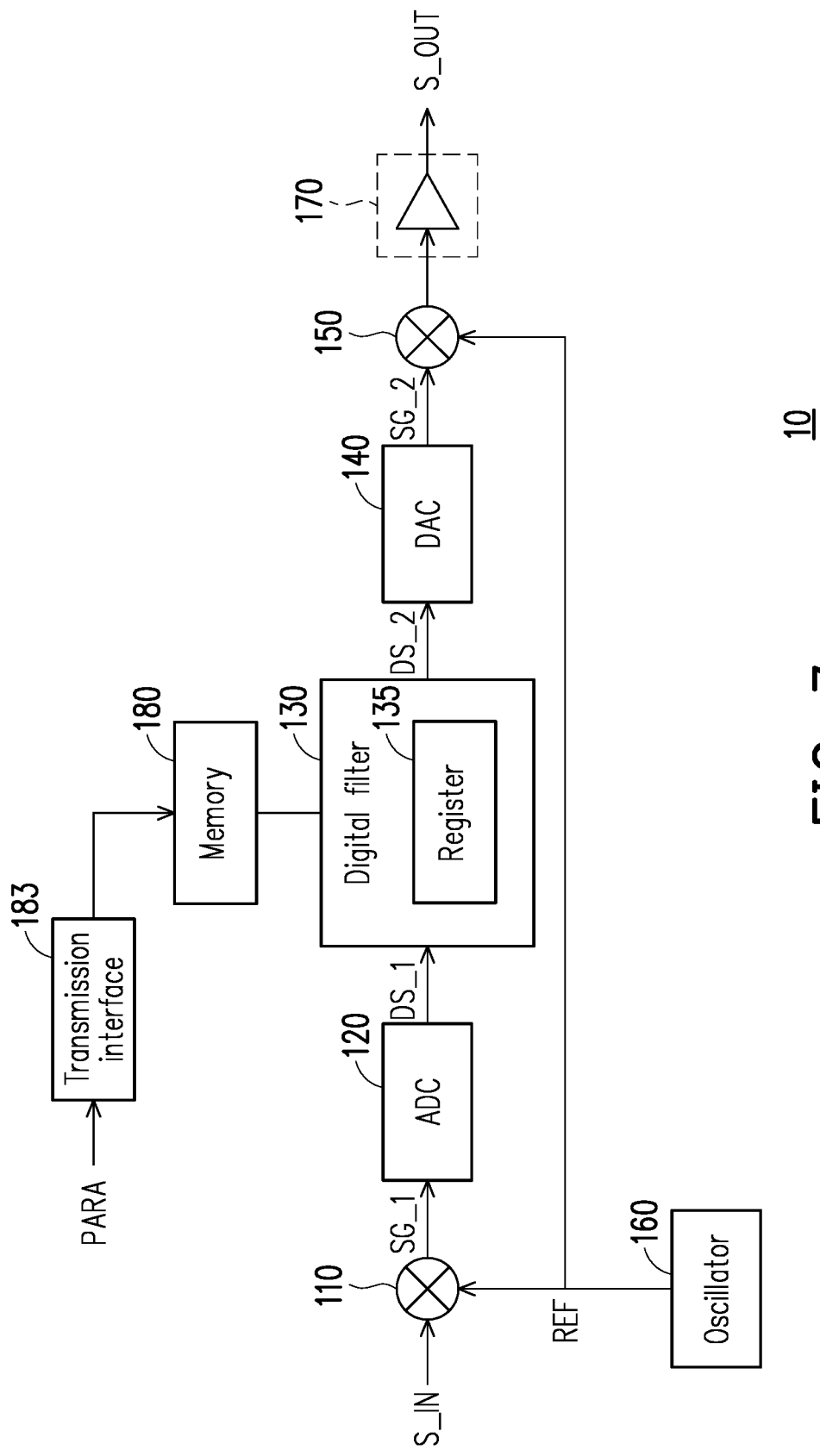
FIG. 7 is a schematic diagram of a filter system according to a fifth embodiment of the disclosure.

FIG. 7 is a schematic diagram of a filter system according to a fifth embodiment of the disclosure. Referring to FIG. 7, in one embodiment, the digital filter 130 includes a register 135. The register 135 stores multiple first weighting coefficients. The first weighting coefficients correspond to the first frequency band. The digital filter 130 operates on the first digital signal DS_1 according to the first weighting coefficients to generate a second digital signal DS_2. In one embodiment, the register 135 stores multiple second weighting coefficients corresponding to a second frequency band. After the digital filter 130 receives (or reads) a switching signal (or a switching command), the digital filter 130 operates on the first digital signal DS_1 according to the second weighting coefficients to generate a second digital signal DS_2. The switching signal instructs the digital filter 130 to switch from the first frequency band to the second frequency band.

As shown in FIG. 7, in one embodiment, the filter system 10 further includes a memory 180. The memory 180 is coupled to the digital filter 130. The memory 180 stores multiple third weighting coefficients corresponding to a third frequency band. In one embodiment, after the digital filter 130 receives (or reads) an update signal (or an update command), the digital filter 130 reads the third weighting coefficients from the memory 180 and updates the first weighting coefficients stored in the register to the third weighting coefficients, in which the update signal instructs the digital filter 130 to update to the third frequency band. The memory 180 is, for example, any type of fixed or movable random access memory (RAM), read-only memory (ROM), flash memory, hard disk drive (HDD), solid state drive (SSD), or similar elements, or a combination thereof.

Referring to FIG. 7 again, in one embodiment, the filter system 10 further includes a transmission interface 183. The transmission interface 183 is coupled to the memory 180. The transmission interface 183 receives the setting message PARA, and transmits the setting message PARA to the memory 180 for storage. The setting message PARA includes multiple fourth weighting coefficients corresponding to a fourth frequency band. Specifically, the transmission interface 183 may be a serial or parallel interface, such as a serial peripheral interface (SPI) or an inter-integrated circuit (IIC) interface. In one embodiment, the setting message PARA may include a switching signal (also referred to as a switching command) or an update signal (also referred to as an update command).

Specifically, since the target frequency band may be a frequency band of different communication specifications, such as ZWAVE, NB-IoT or the operating frequency band of 4G and 5G mobile communication regulated by different countries, with different communication specifications, when the target frequency band is changed or switched to different specifications, the first signal SG_1 generated by the down-conversion of the input signal S_OUT may include the operating frequency corresponding to the different communication specifications. For example, the first signal SG_1 may include the first frequency, the second frequency, the third frequency, or the fourth frequency. The first frequency band corresponds to the first frequency. The second frequency band corresponds to the second frequency. The third frequency band corresponds to the third frequency. The fourth frequency band corresponds to the fourth frequency. At this time, the digital filter 130 may store multiple sets of weighting coefficients corresponding to different communication specifications, and switch between different frequency bands (the first frequency band, the second frequency band, the third frequency band, or the fourth frequency band) according to requirements. It should be noted that since the filter system 10 uses the first mixer 110 to down-convert the first signal SG_1 and the second mixer 150 to up-convert the second signal SG_2, therefore, the digital filter 130 may be operated smoothly if the first frequency band, the second frequency band, the third frequency band, or the fourth frequency band for filtering falls within the base frequency or the intermediate frequency. In this way, the hardware design requirement of the digital filter 130 may be reduced.

According to the fifth embodiment of the disclosure, the register 135 stores multiple first weighting coefficients corresponding to the first frequency band, and the register 135 stores multiple second weighting coefficients corresponding to the second frequency band. That is, the filter system 10 may store multiple first weighting coefficients or multiple second weighting coefficients corresponding to different communication specifications in the register 135, and when the digital filter 130 receives the switching signal, the digital filter 130 switches from the first frequency band to the second frequency band. Moreover, in the fifth embodiment of the disclosure, the filter system 10 may further store multiple third weighting coefficients corresponding to a third frequency band through the memory 180, and after the digital filter 130 receives an update signal, the digital filter 130 is updated to the third frequency band. In addition, in the fifth embodiment of the disclosure, the filter system 10 may also transmit the setting message PARA including multiple fourth weighting coefficients corresponding to a fourth frequency band to the memory 180 for storage through the transmission interface 183. In this way, a single filter system 10 may switch between different communication specifications, so as to achieve the technical effect of replacing multiple existing filter products.

Sixth Embodiment

Figure 8:
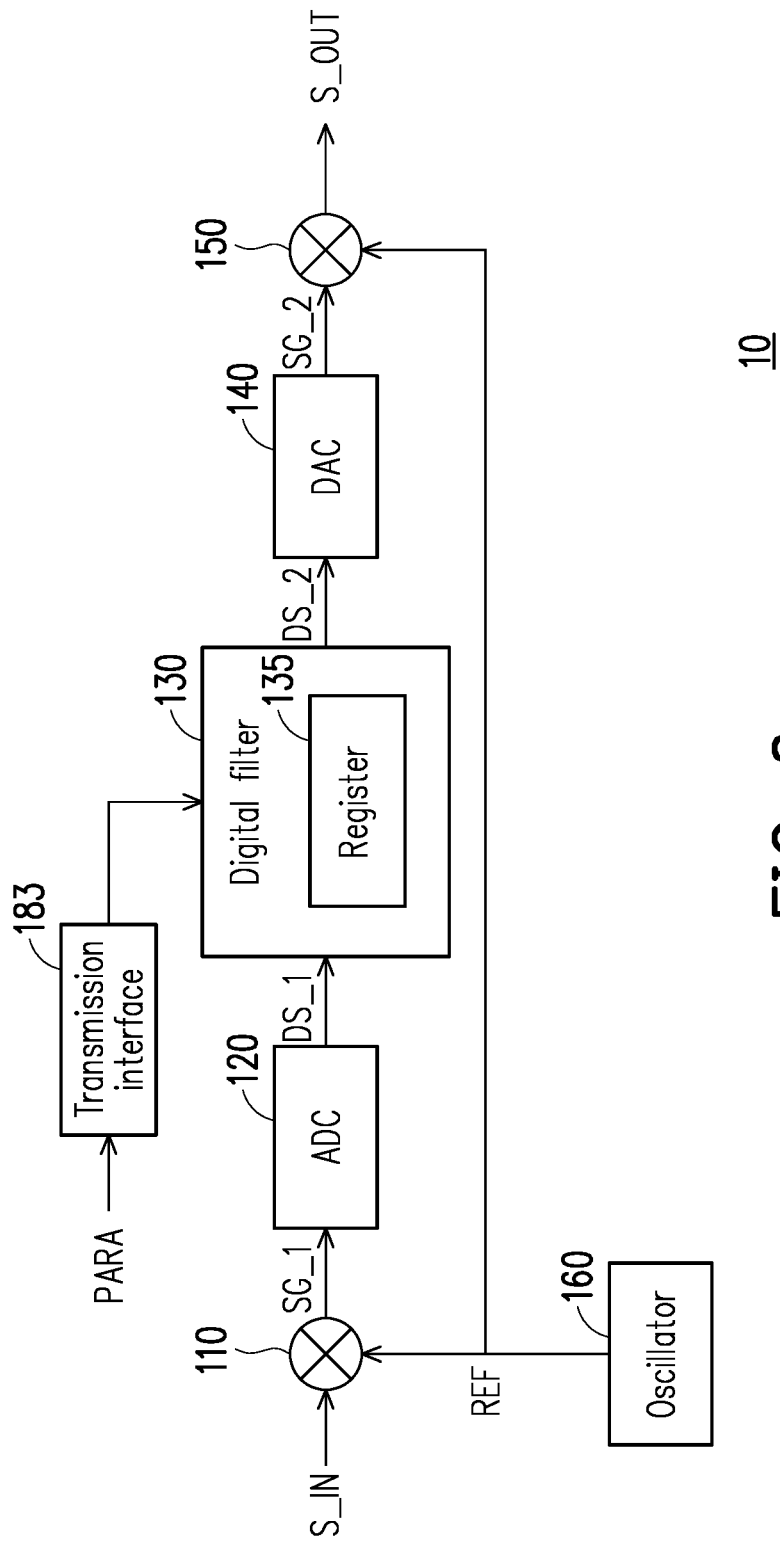
FIG. 8 is a schematic diagram of a filter system according to a sixth embodiment of the disclosure.

FIG. 8 is a schematic diagram of a filter system according to a sixth embodiment of the disclosure. Referring to FIG. 8, in one embodiment, the filter system 10 further includes a transmission interface 183. The transmission interface 183 is coupled to the digital filter 130. The transmission interface 183 receives the setting message PARA, and transmits the setting message PARA to the digital filter 130. In one embodiment, the setting message PARA includes multiple third weighting coefficients corresponding to the third frequency band, and the transmission interface 183 may directly update the third weighting coefficients of the digital filter 130 through the setting message PARA. For example, the transmission interface 183 may transmit the setting message PARA to the register 135 of the digital filter 130. After the digital filter 130 receives the setting message PARA, the digital filter 130 updates the first weighting coefficients to the third weighting coefficients according to the setting message PARA.

The setting message PARA includes multiple third weighting coefficients corresponding to a third frequency band. Specifically, the transmission interface 183 may be a serial or parallel interface, such as a serial peripheral interface (SPI) or an inter-integrated circuit (IIC) interface.

In one embodiment, the setting message PARA may include a switching signal (also referred to as a switching command) or an update signal (also referred to as an update command).

To sum up, the embodiment of the disclosure adjusts the filter frequency band through a programmable structure, and may replace multiple existing filter products with a single filter system structure. Compared with the prior art, multiple surface acoustic wave elements is required to conform to different communication specifications, the embodiments of the disclosure may reduce the cost of using a large number of passive elements. On the other hand, with the active filtering structure adopted in the embodiment of the disclosure, the signal gain may improve the use efficiency of the communication product when the signal strength is insufficient, and effectively enhance the function of the communication product.

Although the disclosure has been described in detail with reference to the above embodiments, they are not intended to limit the disclosure. Those skilled in the art should understand that it is possible to make changes and modifications without departing from the spirit and scope of the disclosure. Therefore, the protection scope of the disclosure shall be defined by the following claims.

What is claimed is:

1. A filter system, comprising:
    a first mixer, converting an input signal into a first signal according to a reference frequency signal, wherein the reference frequency signal corresponds to a target frequency band;
    an analog-to-digital converter, coupled to the first mixer to convert the first signal into a first digital signal;
    a digital filter, coupled to the analog-to-digital converter to filter the first digital signal according to a first frequency band to generate a second digital signal, wherein the first frequency band corresponds to the first signal;
    a digital-to-analog converter, coupled to the digital filter to convert the second digital signal into a second signal; and
    a second mixer, coupled to the digital-to-analog converter to convert the second signal into an output signal according to the reference frequency signal, wherein the output signal corresponds to the input signal filtered by the target frequency band.

2. The filter system according to claim 1, further comprising:
    an oscillator, coupled to the first mixer and the second mixer and providing the reference frequency signal to the first mixer and the second mixer.

3. The filter system according to claim 2, further comprising:
    an adjustment interface, coupled to the oscillator and transmitting an adjustment signal to the oscillator, wherein the adjustment signal corresponds to the target frequency band, wherein the oscillator adjusts the reference frequency signal according to the adjustment signal.

4. The filter system according to claim 1, further comprising:
    a gain controller, comprising:
    an amplifier, coupled to the second mixer and amplifying the output signal; and
    a control interface, coupled to the amplifier and controlling a signal gain of the amplifier.

5. The filter system according to claim 4, wherein the control interface detects a signal strength of the input signal, and determines the signal gain according to the signal strength of the input signal.

6. The filter system according to claim 4, wherein the control interface receives a control message, and determines the signal gain according to the control message.

7. The filter system according to claim 1, further comprising:
    an input amplifier, coupled to the first mixer and amplifying the input signal.

8. The filter system according to claim 1, wherein the first signal comprises a first frequency, wherein the first frequency band corresponds to the first frequency, wherein the digital filter stores a plurality of first weighting coefficients, wherein the first weighting coefficients correspond to the first frequency band, and the digital filter operates on the first digital signal according to the first weighting coefficients to generate the second digital signal.

9. The filter system according to claim 8, wherein the first signal further comprises a second frequency, wherein a second frequency band corresponds to the second frequency, wherein the digital filter further stores a plurality of second weighting coefficients corresponding to the second frequency band, wherein after the digital filter receives a switching signal, the digital filter operates on the first digital signal according to the second weighting coefficients to generate the second digital signal, wherein the switching signal instructs the digital filter to switch from the first frequency band to the second frequency band.

10. The filter system according to claim 8, wherein the first signal further comprises a third frequency, wherein a third frequency band corresponds to the third frequency, and the filter system further comprises:
- a memory, coupled to the digital filter and storing a plurality of third weighting coefficients corresponding to the third frequency band, wherein
- after the digital filter receives an update signal, the digital filter reads the third weighting coefficients from the memory and updates the first weighting coefficients that are stored to the third weighting coefficients, wherein the update signal instructs the digital filter to update to the third frequency band.

11. The filter system according to claim 10, wherein the first signal further comprises a fourth frequency, wherein a fourth frequency band corresponds to the fourth frequency, and the filter system further comprises:
- a transmission interface, coupled to the memory, receiving a setting message, and transmitting the setting message to the memory for storage, wherein the setting message comprises a plurality of fourth weighting coefficients corresponding to the fourth frequency band.

12. The filter system according to claim 8, wherein the first signal further comprises a third frequency, wherein a third frequency band corresponds to the third frequency, and the filter system further comprises:
- a transmission interface, coupled to the digital filter, receiving a setting message, and transmitting the setting message to the digital filter, wherein the setting message comprises a plurality of third weighting coefficients corresponding to the third frequency band, wherein
- after the digital filter receives the setting message, the digital filter updates the first weighting coefficients to the third weighting coefficients according to the setting message.

13. An operation method, suitable for a filter system, comprising:
- converting an input signal into a first signal according to a reference frequency signal, wherein the reference frequency signal corresponds to a target frequency band;
- converting the first signal into a first digital signal;
- filtering the first digital signal according to a first frequency band to generate a second digital signal, wherein the first frequency band corresponds to the first signal
- converting the second digital signal into a second signal; and
- converting the second signal into an output signal according to the reference frequency signal, wherein the output signal corresponds to the input signal filtered by the target frequency band.

14. The operation method according to claim 13, further comprising:
- transmitting an adjustment signal through an adjustment interface; and
- adjusting the reference frequency signal according to the adjustment signal, wherein the adjustment signal corresponds to the target frequency band.

15. The operation method according to claim 13, further comprising:
- amplifying the output signal through an amplifier; and
- controlling a signal gain of the amplifier through a control interface.

16. The operation method according to claim 15, wherein controlling the signal gain of the amplifier through the control interface comprises:
- detecting a signal strength of the input signal, and determining the signal gain according to the signal strength of the input signal.

17. The operation method according to claim 15, wherein controlling the signal gain of the amplifier through the control interface comprises:
- receiving a control message, and determining the signal gain according to the control message.

18. The operation method according to claim 13, wherein the first signal comprises a first frequency, wherein the first frequency band corresponds to the first frequency, and the operation method further comprises:
- storing a plurality of first weighting coefficients, operating on the first digital signal according to the first weighting coefficients to generate the second digital signal, wherein the first weighting coefficients correspond to the first frequency band.

19. The operation method according to claim 18, wherein the first signal further comprises a second frequency, wherein a second frequency band corresponds to the second frequency, further comprising:
- storing a plurality of second weighting coefficients corresponding to the second frequency band;
- receiving a switching signal, wherein the switching signal instructs the filter system to switch from the first frequency band to the second frequency band; and
- operating on the first digital signal according to the second weighting coefficients to generate the second digital signal.

20. The operation method according to claim 18, wherein the first signal comprises a third frequency, wherein a third frequency band corresponds to the third frequency, and the operation method further comprises:
- storing a plurality of third weighting coefficients corresponding to the third frequency band in a memory;
- receiving an update signal, wherein the update signal instructs the filter system to update to the third frequency band; and
- updating the first weighting coefficients that are stored to the third weighting coefficients.

21. The operation method according to claim 20, further comprising:
- receiving a setting message through a transmission interface, and transmitting the setting message to the memory for storage.

22. The operation method according to claim 21, wherein the first signal further comprises a fourth frequency, wherein a fourth frequency band corresponds to the fourth frequency, wherein the setting message comprises a plurality of fourth weighting coefficients corresponding to the fourth frequency band.

23. The operation method according to claim 18, wherein the first signal comprises a third frequency, wherein a third frequency band corresponds to the third frequency, and the operation method further comprises:
- receiving a setting message through a transmission interface, wherein the setting message comprises a plurality of third weighting coefficients corresponding to the third frequency band, wherein the setting message instructs the filter system to update the first weighting coefficients to the third weighting coefficients.

* * * * *